US008407378B2

(12) United States Patent
Marulkar (10) Patent No.: US 8,407,378 B2
(45) Date of Patent: Mar. 26, 2013

(54) HIGH-SPEED INLINE DATA COMPRESSION INLINE WITH AN EIGHT BYTE DATA PATH

(75) Inventor: Rajendra Sadanand Marulkar, Pune (IN)

(73) Assignee: LSI Corporation, Milpitas, CA (US)

( * ) Notice: Subject to any disclaimer, the term of this patent is extended or adjusted under 35 U.S.C. 154(b) by 1008 days.

(21) Appl. No.: 12/427,759

(22) Filed: Apr. 22, 2009

(65) Prior Publication Data

US 2010/0274926 A1  Oct. 28, 2010

(51) Int. Cl.
  *G06F 13/00*  (2006.01)
  *G06F 13/12*  (2006.01)
  *G06F 13/38*  (2006.01)
(52) U.S. Cl. ............... 710/33; 710/65; 710/66; 710/68
(58) Field of Classification Search .................. None
  See application file for complete search history.

(56) References Cited

U.S. PATENT DOCUMENTS

| | | | |
|---|---|---|---|
| 5,506,580 A | | 4/1996 | Whiting et al. |
| 5,532,694 A | | 7/1996 | Mayers et al. |
| 5,838,891 A | * | 11/1998 | Mizuno et al. ............ 714/5.11 |
| 6,327,671 B1 | * | 12/2001 | Menon ........................ 714/6.12 |
| 6,466,999 B1 | * | 10/2002 | Sliger et al. ..................... 710/68 |
| 7,051,126 B1 | * | 5/2006 | Franklin ........................ 710/68 |
| 7,376,863 B2 | * | 5/2008 | Benhase et al. ............. 714/6.22 |
| 7,532,134 B2 | * | 5/2009 | Samuels et al. ................. 341/87 |
| 7,870,358 B2 | * | 1/2011 | Yang ........................... 711/170 |
| 2003/0005189 A1 | | 1/2003 | Wilson et al. |
| 2008/0104484 A1 | * | 5/2008 | Jacobson ....................... 714/770 |

OTHER PUBLICATIONS

Serial Attached SCSI 48300 Kit 8 Port Pcix Lp 64BIT 133MHZ Rohs, Adaptec, Apr. 18, 2006, http://www.amazon.com/Serial-Attached-48300-64BIT-133MHZ/dp/B000FFLYGY.*
QuickSpecs for HP 8 Internal Port SAS HBA with RAID, Hewlett Packard, 2006, http://h18000.www1.hp.com/products/quickspecs/archives_North_America/12332_na_v5/12332_na.PDF.*
Paul Griffith, Maximizing Server Storage Performance with PCI Express™ and Serial Attached SCSI, Adaptec, Inc, Nov. 2003, http://www.adaptec.com/en-us/_whitepapers/tech/sas/infostar_sas_article.htm.*

\* cited by examiner

*Primary Examiner* — Kris Rhu
(74) *Attorney, Agent, or Firm* — Raj Abhyanker, P.C.

(57) ABSTRACT

Several methods and a system to implement data compression inline with an eight byte data path are disclosed. In one embodiment, a method includes acquiring a data from a host. In addition, the method includes applying an eight byte data path to the data. The method also includes compressing the data inline. The method may further include writing the data in a memory through a memory controller using a RAID engine. The method may also include manipulating the data through the RAID engine. In addition, the method may include reading the data through a Serial Attached SCSI (SAS) core. The method may further include writing the data to a non-volatile storage. The method may include applying a compression technique based on a data history. The method may also include maintaining a consistent order of a sequence of the data during a data compression operation and a decompression operation.

20 Claims, 5 Drawing Sheets

FIGURE 4

HIGH-SPEED INLINE DATA COMPRESSION INLINE WITH AN EIGHT BYTE DATA PATH

FIELD OF TECHNOLOGY

This disclosure relates generally to field of storage technology and associated compression operations, and more particularly to a data compression.

BACKGROUND

A compression operation may work on a byte level per cycle basis. An internal data path of a Redundant Array of Independent Disks (RAID) engine may be 8 bytes in many products. The compression operations may not work at 8 bytes per data cycle. In addition, performance bottlenecks may be caused because of the operation may not work based on being next in a line of succession (e.g., inline).

SUMMARY

This summary is provided to comply with 37 C.F.R. 1.73, recommending a summary of the invention briefly indicating the nature and substance of the invention. It is submitted with the understanding that it will not be used to limit the scope or meaning of the claims.

Several methods and system to implement high speed inline data compression inline with an eight byte data path are disclosed.

In an exemplary embodiment, a method includes acquiring a data from a host. In addition, the method includes applying an eight byte data path to the data. The method also includes compressing the data inline. The method may further include writing the data in a memory through a memory controller using a RAID engine.

In an exemplary embodiment, a system includes a host and a Peripheral Component Interconnect Express (PCIe) Core to read a data from the host. In addition, the system includes a RAID engine to manipulate the data and write the data to a non-volatile storage compress the data inline with an eight byte data path. The system also includes a data compressor to compress the data inline with the eight byte data path. The system further includes another RAID engine to decompress the data written to a non-volatile storage. The system also includes a memory controller to write the data to a memory.

The methods, systems, and apparatuses disclosed herein may be implemented in any means for achieving various aspects, and may be executed in a form of a machine-readable medium embodying a set of instructions that, when executed by a machine, cause the machine to perform any of the operations disclosed herein. Other features will be apparent from the accompanying drawings and from the detailed description that follows.

BRIEF DESCRIPTION OF THE DRAWINGS

Example embodiments are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

Several methods and system to implement high speed inline data compression inline with an eight byte data path are disclosed.

Although the present embodiments have been described with reference to specific example embodiments, it will be evident that various modifications and changes may be made to these embodiments without departing from the broader spirit and scope of the various embodiments.

Figure 1:
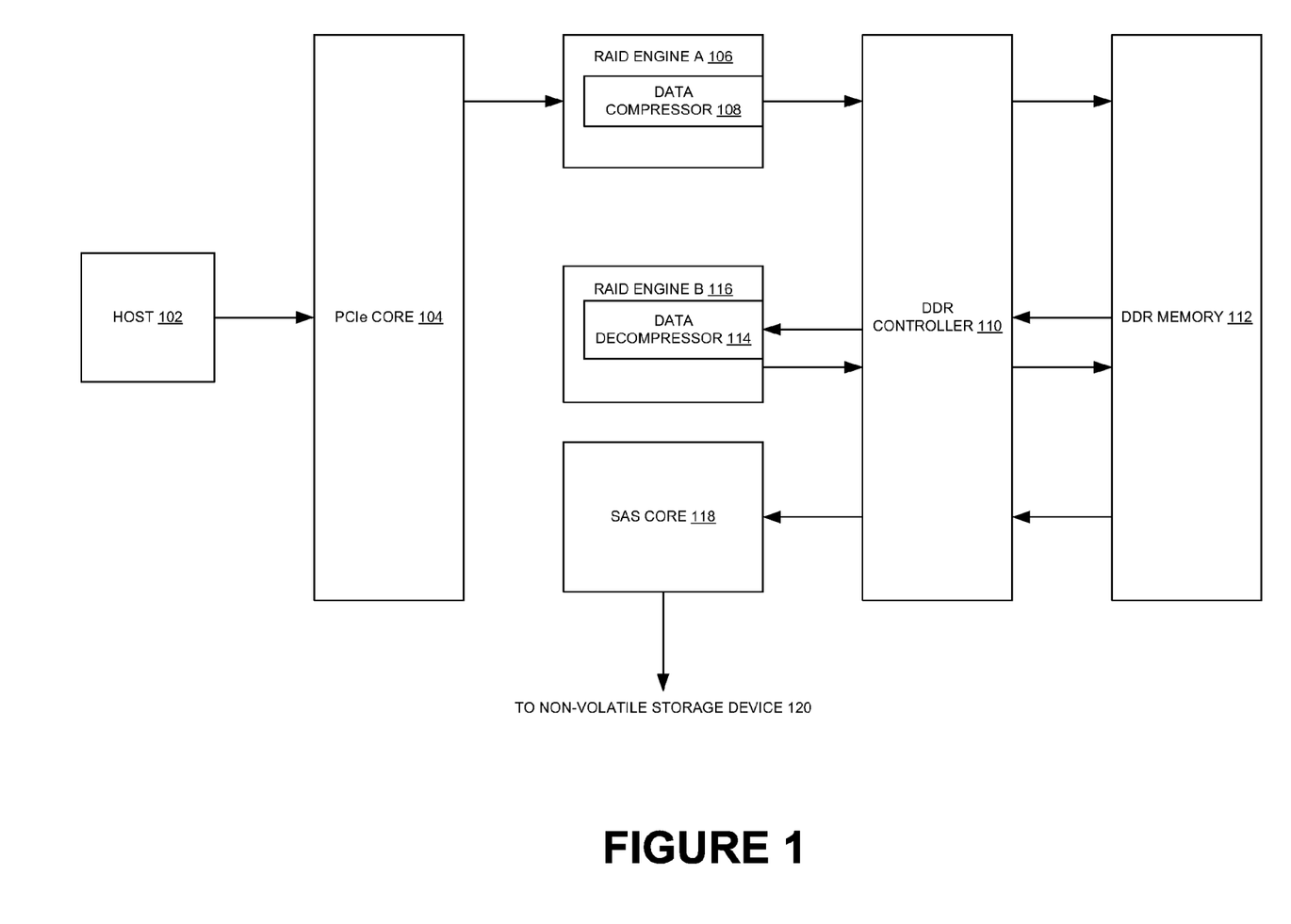
FIG. 1 is a system view illustrating data storage operation to a non-volatile memory, according to one embodiment.

FIG. 1 is a system view illustrating data storage operation to a non-volatile memory, according to one embodiment. In particular, FIG. 1 illustrates a host 102, a PCIe core 104, a RAID engine A 106, a data compressor 108, a Data Double Rate (DDR) controller 110, a DDR memory 112, a data decompressor 114, a RAID engine B 116, a Serial Attached SCSI (SAS) core 118, and a non-volatile storage device 120, according to one embodiment.

The host 102 includes a software that communicates data to a client device. The host 102 may also be a server or another client device that is communicatively coupled to the client device through a network. In example embodiments, the network may include LAN, WAN, SAN, NAS, internet or any other means that enable communication between the client devices and the host 102. The client device includes the PCIe core 104 for receiving data from the host 102. In a virtualized environment, there may be one or more hosts from which a PCIe core 104 to receive data.

The PCIe core 104 acts as a buffer to hold data and to communicate the data to the DDR memory 112. The PCIe core 104 is a layered protocol that interconnects between peripheral devices. The PCIe core 104 may also interconnect external devices with a peripheral component of the client device. The PCIe core 104 communicates the data to the RAID engine A 106. The RAID engine A 106 includes a software controlled hardware that converts the incoming data into an I/O plan. For example, the incoming data may include a set of data blocks to be read, a set of data to be XOR-ed (in cases of RAID operation which may use XOR operation), and a set of data to be written.

The RAID engine A 106 includes a data compressor 108. The data compressor 108 performs data compression inline with an eight byte data path. Data compression includes an operation to reduce the amount of data to be stored or transmitted. A data compression operation generates a history table.

The history table is utilized to compress and decompress data. The history table includes a recent history information associated with a flow of data, particular data byte information or number of times the data byte being transmitted. In this particular example embodiment, the XOR buffer in the compressor 106 is of 1K size. The data compression is designed for 1K boundary for commands that use XOR operation. The data compression at the 1K level assists in a clearing operation of the history table. The data is then compressed in individual 1K blocks. The compression technique applies according to the data history.

The compressed data is then communicated to the DDR controller 110. The DDR controller 110 initializes and manages the data banks. In addition, the DDR controller 110 may keep the DDR memory 112 refreshed at appropriate intervals. The DDR controller 110 translates, reads and writes requests from the RAID engine A 106 into a necessary command signals to enable execution engine to communicate data. The DDR controller 110 communicates data to the DDR memory 112. The RAID engine A 106 and the DDR controller 110 are communicatively coupled to each other.

The DDR memory 112 is a class of memory integrated circuit that stores data. The data in the DDR memory 112 is read by the data decompressor 114 of the RAID engine B 116 through the DDR controller 110. The compressed data is decompressed by the data decompressor 114 of the RAID engine B 116. In an example embodiment, the data decompressor 114 decompresses the data based on the history table.

The RAID engine B 116 includes another RAID engine to manipulate the decompressed data. Furthermore, the manipulated data is written back into the DDR memory 112. The RAID engine B 116 is communicatively coupled to the DDR controller 110. The DDR controller 110 is communicatively coupled to the DDR memory 112. The SAS core 118 includes a hardware that communicates data between the memory devices. In an example embodiment, the SAS core 118 communicates data from the DDR memory 112 through the DDR controller to a non-volatile storage device in the client device. The SAS core 118 is communicatively coupled to the DDR controller 110. In certain cases, the SAS core 118 may include a decompresssor to decompress data. In addition, the SAS core 118 includes decompressor in certain example embodiments that does not use the RAID engine B 116.

The compression and the decompression operations are performed in a consistent order. The compression operation and the decompression operation are performed inline with the movement of data. A history table is built to maintain a consistent order in the sequence of data.

In an embodiment, the data is read in a form of a scatter/gather List (SGL). The data is compressed in 1K chunks and written into the DDR memory 112. A SGL may include several SGL elements of size more than 1K. There may be more than one host that communicates data to the client device. In an example embodiment, the compressor sets an IO boundary for performing compression.

Figure 2:
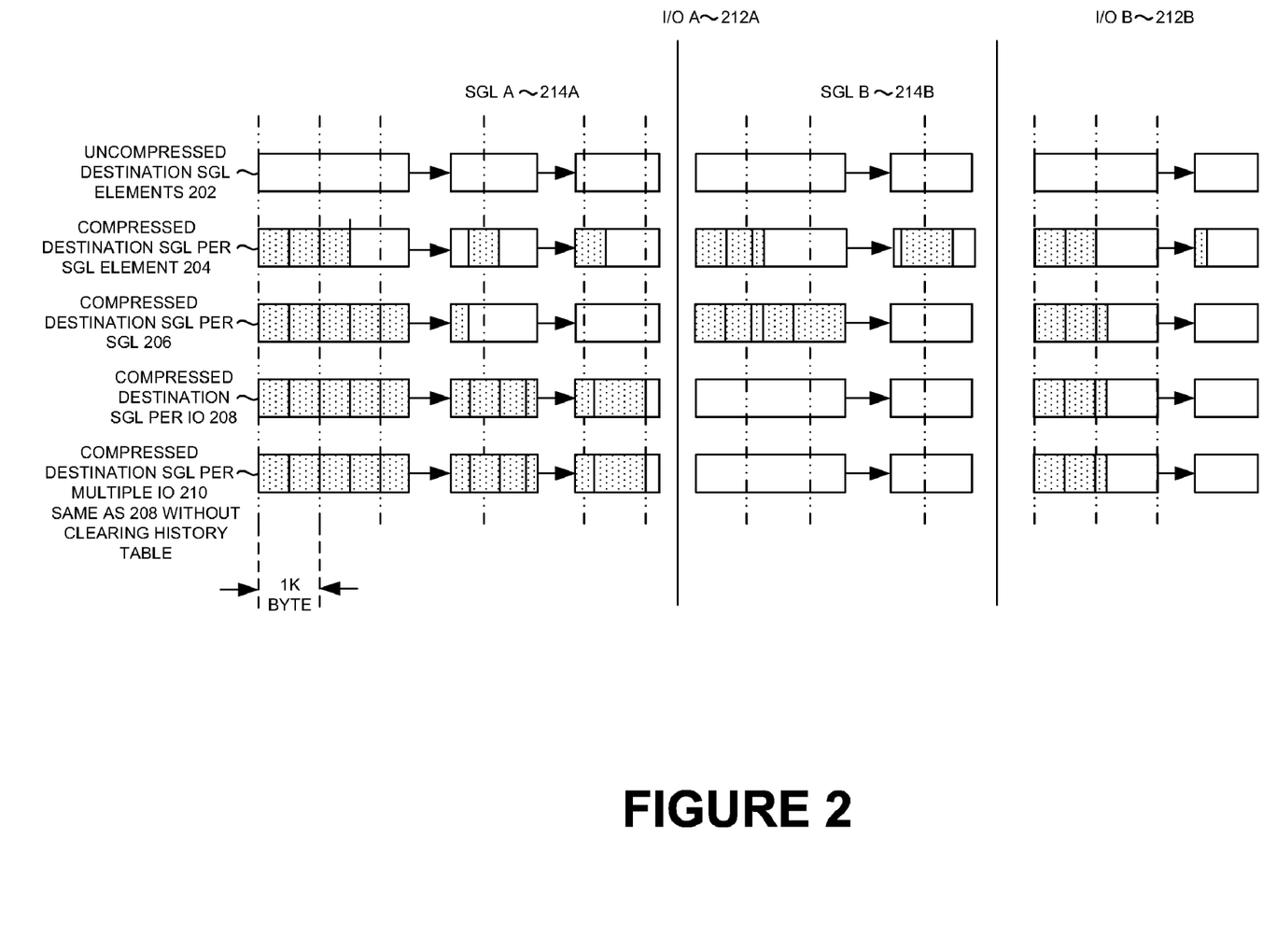
FIG. 2 illustrates use of an SGL and possible compression operations, according to one embodiment.

FIG. 2 illustrates use of an SGL and possible compression operations. More particularly, FIG. 2 illustrates an example data arrangement after a data compression operation in a Scatter Gather List (SGL), according to one embodiment. In particular, FIG. 2 illustrates an uncompressed destination SGL data 202, a compressed destination SGL per SGL element 204, a compressed destination SGL per SGL 206, compressed destination SGL per IO 208, a compressed destination SGL per multiple IO 210, IO A 212A, IO B 212B, SGL A 214A, and SGL B 214B, according to one embodiment.

The incoming data is read into the data compressor 108 in a form of the Scatter Gather List (SGL). The SGL includes a list of vectors which provides location and length of data segment to where data resides. Each shaded block in the SGL element represents 512 bytes. The data is compressed to the 1K byte level in order to facilitate compression or transmission. The high-speed inline compression operation implements in several ways. The data is compressed and placed using the high-speed inline compression operation in various ways as illustrated below.

In an example embodiment, the IO A 212A includes input data from one of a host from the virtualized environment. The IO B 212B includes an input data from another host from the virtualized environment. The IO may B 212B include incoming data. In an example embodiment, the IO A 212A may have two SGL elements SGL A 214A and SGL B 214B. FIG. 2 illustrates the destination SGL elements with arrangement of uncompressed and compressed data for various modes of compression. The uncompressed destination SGL data 202 illustrates uncompressed data with boundary lines marked at 1K. The compressed destination SGL per SGL element 204 illustrates data compressed per SGL element. More than one SGL element may be extant per SGL. In the compressed destination SGL per SGL element 204 case, the data is compressed on per element basis. The remaining memory may be left unused. The compressed destination SGL per SGL 206 exemplifies an example embodiment where the data in whole SGL A 214A is compressed and placed consecutively per SGL. The remaining memory that can include an SGL element can remain unused. The compressed destination SGL per IO 208 may be associated with a data compression operation performed at IO level. The data in the SGL elements of IO A 212A is compressed and placed in available spaces in SGL elements. The remaining memory can remain unused. The compressed destination SGL per multiple IO 210B illustrates a case of data compression may as performed across multiple IOs. In this particular example embodiment with the compressed destination SGL per multiple IO 210B, the history table may not be cleared.

More than one host may communicate data to the client device. According to this example embodiment, the data communicated is modified into 1 kilo byte chunks of data. The RAID engine A 106 reads the data from the PCIe core 104. The RAID engine A 106 compresses the data through the data compressor 108. The compressed data is placed in the DDR memory 112 via the DDR controller 110. An I/O boundary set may be located between the data from each host. The read data is included in an SGL. The RAID engine B 116 performs an XOR operation. In cases where the XOR operation is performed, the history table may be cleared at a 1K boundary. An I/O boundary may include more than 1 SGL element. The SGL element may include more than 1K of data. The I/O boundary represents an instant of time from which the RAID engine B 116 performs a data compression operation on data communicated by a host.

In an example embodiment, the data is read from the host 102 in strips. The strip includes a set of data that has been split by a RAID engine to accommodate the data into a volume or to perform an XOR operation. The RAID engine B 116 is be a hardware block. The RAID engine B 116 may not have sufficient buffer to hold several strips of data to perform XOR operation. Consequently, a 1K chunk of data is read from a strip and the XOR operation is performed at each iteration with a previous data. For example, there may be three strips: strip 1, strip 2, and strip 3. The RAID engine B 116 may read a 1K chunk of data of strip 1 and then a 1K chunk of data of strip 2 and then a 1K chunk of data of strip 3. The 1K chunk of data of strip 2 is XORed with a previous data (e.g. a 1K chunk of strip 1 data). The XORed data and the previous data is written into the DDR memory 112. This process continues until the data is written into the DDR memory 112. The data is managed in 1K chunks. The history table at 1K boundary is cleared as the XOR buffer is only 1 Kbyte.

Figure 3A:
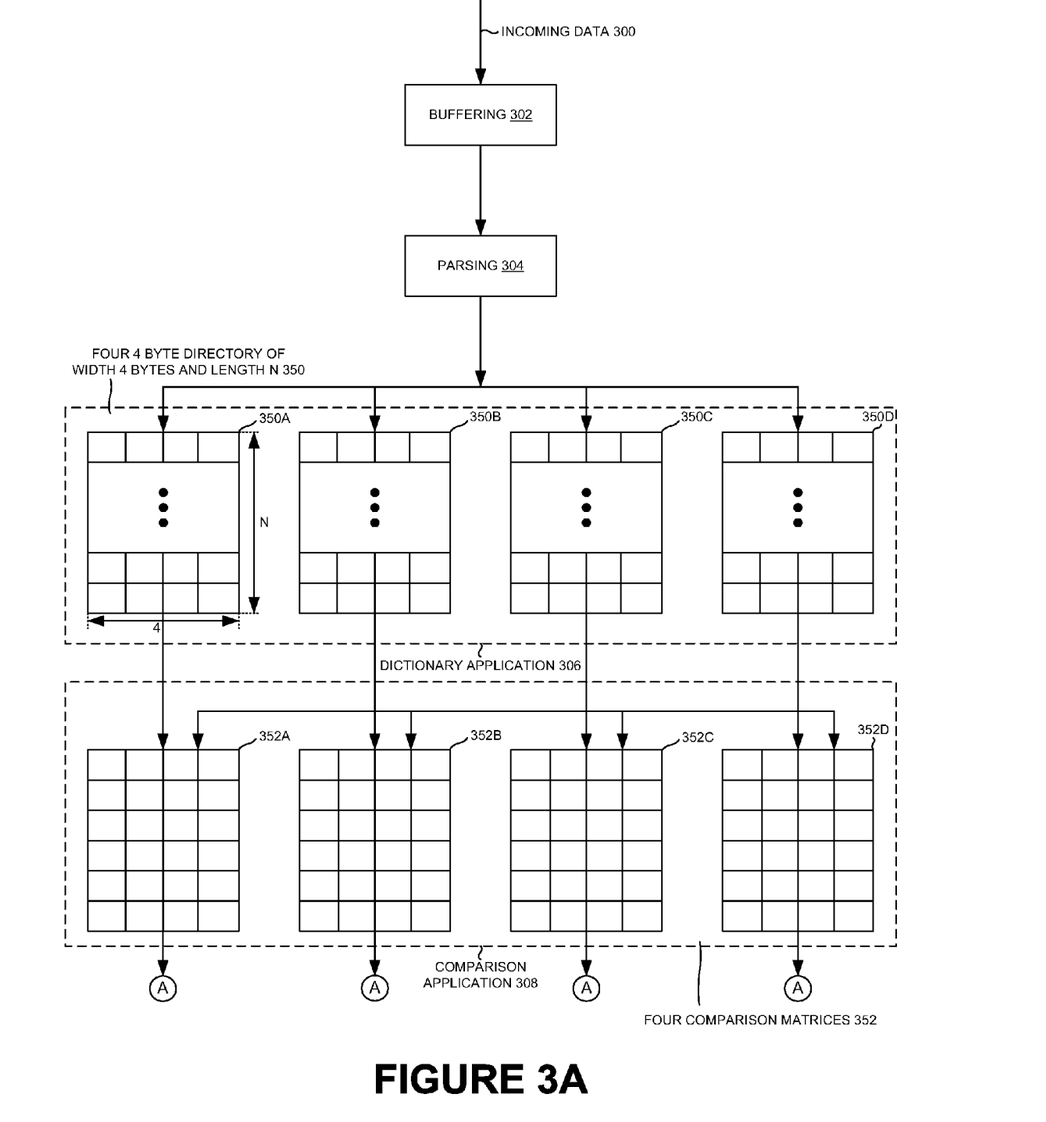
FIG. 3A illustrates a step by step procedure of implementing a high speed inline compression technique, according to one embodiment.

FIG. 3A illustrates a step by step procedure of implementing a high speed inline compression technique, according to an example embodiment. In operation 300, the data is extracted from the host 102. In operation 302, data is received from the PCIe core 104. The received data is temporarily stored in the 16 byte buffer. In operation 304, the data is parsed for programmable special characters. The special characters may vary based on kind of information being communicated. For example, a 'space' may be considered as one of a special character in text related data. The data may be parsed in such a way that there is good chance of match for coding. For example, a particular word may occur frequently. The word occurring frequently is assigned a code. Each time the same word occurs the word is coded using the similar code. The Random parsing divides a word into different words, which uses a different code. However, careful parsing of words by sensing the possibility of the occurrence of word uses less coding. This is because the word occurring frequently has a code assigned to the word. In an example embodiment, the 16 byte word is parsed logically and sent into four 4 bytes directories 350 in next operation. For example, a sentence "let us write this" may have to be parsed. Considering four byte directory lane (e.g., the sixteen byte data is divided into four bytes each) the sentence may be parsed as "let_" "us_w" "rite" "this". Parsing the sentence the said way may use more coding. For example, "us_w", and "rite" are not frequently occurring and may use assignment of new codes. However, the sentence may be parsed a bit more carefully as "let_" "us_x" "writ" "e_xx" "this". Where 'x' may represent don't care character. As per the above parsing method, there are few words that occur frequently and have definite coding pattern. Words like "let, us, writ, this" occur frequently and do not use coding as these words already have defined codes. In an example embodiment, a dictionary function is used to perform parsing.

In operation 306, a dictionary function is applied to analyze any possible repeating word. The incoming 16-byte both parsed and unparsed data is placed in four 4-byte directories 350. The directory may have width of 4 bytes and length that may be defined by the developer. In another example embodiment, a RAM based dictionary may be used. One dictionary function is used per directory. Certain words that occur frequently, but are not defined in the dictionary. These words are added into the dictionary to reduce the amount of coding.

In operation 308, the data present in the four 4-byte directories 350 is placed in a set of comparison matrices 352. The size of the comparison matrices may be based on the design. Data bytes within a same comparison matrix may be compared. The resultant matches are coded. A non matching data is assigned new code. The information is communicated to the history table. In addition, each comparison matrix is compared with rest of the comparison matrices using a comparator. For example, the comparison matrix 352A may be compared with other compare matrices 352B-D. The resultant matches from all the compare matrices are coded. Furthermore, a cross comparison operation is performed to locate a match with other comparison techniques. For example, if the 4 bytes do not match, there may be a 3 byte match, a 2 byte match, a reverse byte match, and various other matches. Matches are assigned a code and the remaining non-matching bytes are assigned new codes.

Figure 3B:
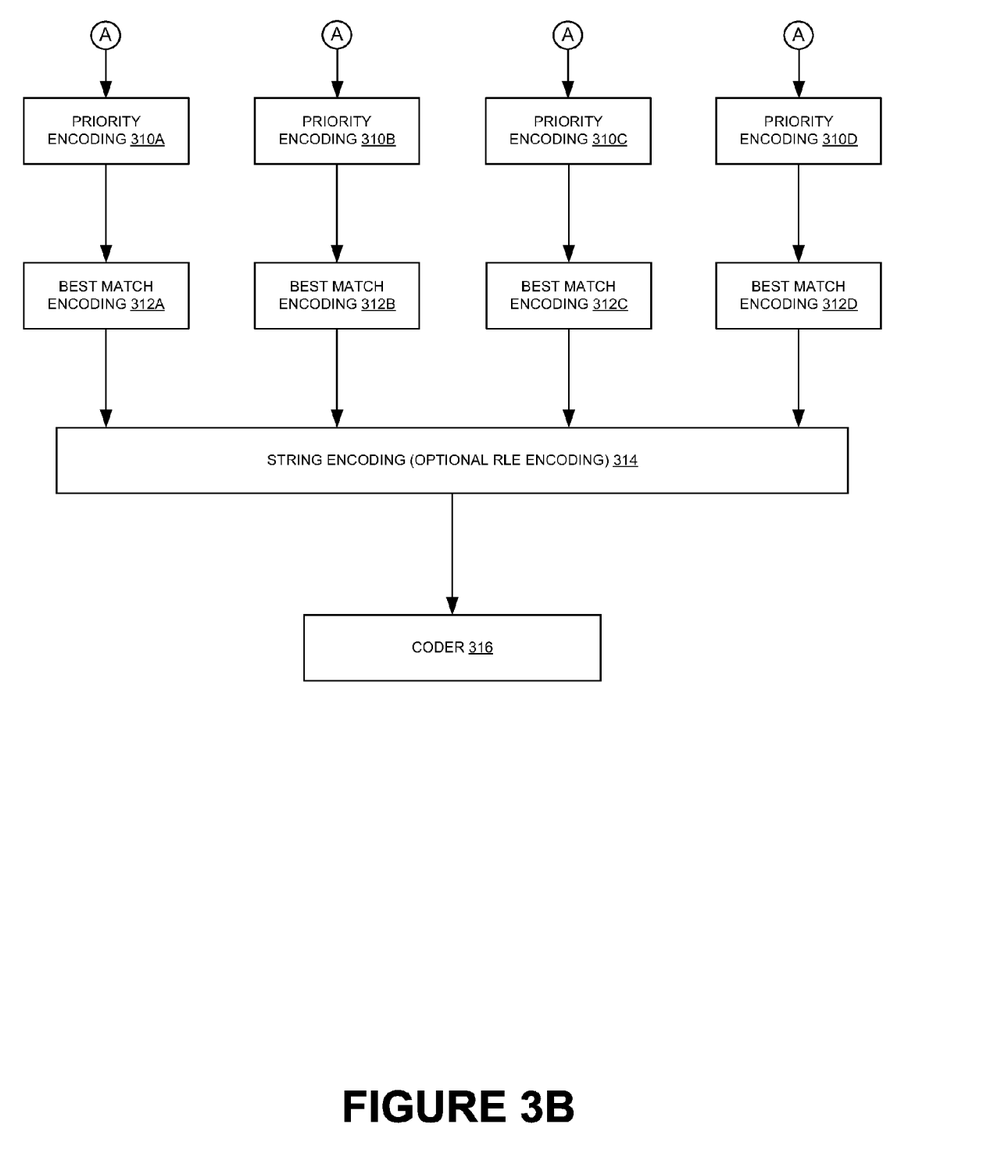
FIG. 3B is a continuation of FIG. 3A illustrating additional operations, according to one embodiment.

FIG. 3B is a continuation of FIG. 3A illustrating additional operations, according to one embodiment. In operation 310A-N, priority encoding is implemented and shorter versions of code are generated. Furthermore, the best match decision between the bytes of the same compare matrix is taken. Sixteen outputs are generated from each of the comparison matrices.

A best-match decision between the comparison matrices is performed by the best-match encoder in operation 312A-N. An output is generated from each of the comparison matrices. The resultant matches are assigned a code. If there is no match, the data is recoded or reassigned a new code. In operation 312, a string encoding operation may be implemented. The string encoding operation generates outputs like match type and a location that would render useful information for coding. In an example embodiment, an optional RLE coder may be used if there are any repeating strings of characters.

The RLE coder codes a particular repeating string of character into two bytes namely run code and run value. The run code includes a number of characters and a run value. The run value may include value of the character in the repeating string. The RLE coding is implemented if there are consecutive full match between the 4 byte words.

In operation 314, coding is implemented for all the data based on the match details. Various coding methods are implemented based on the design. For example, a static Huffman coding is used or a combination of static and dynamic coding is used. Adaptive Huffman coding can also be used along with various other coding schemes of coding based on the design of the developer.

In another embodiment, compressed data may be larger than uncompressed data. The amount of data compressed may not be known. In an example embodiment of this particular operation, the compression and the decompression operations are handled by hardware. Therefore, the compressed data and uncompressed data are compared to determine whether the compressed data is bigger than uncompressed data. In a case where the compressed data size is greater than original uncompressed data, the original uncompressed data is written into the DDR memory 112 and the compressed data is discarded. The compression engine based on the history data may assign flags to the compressed data block and the uncompressed data block. The flag indicates a compression state of the data block. The flags are stored in a separate SGL during compression and decompression operations. The SGL which includes flag information is read with the SGL which has data to determine whether to apply a decompression operation to a 512-byte block that was previous compressed.

Figure 4:
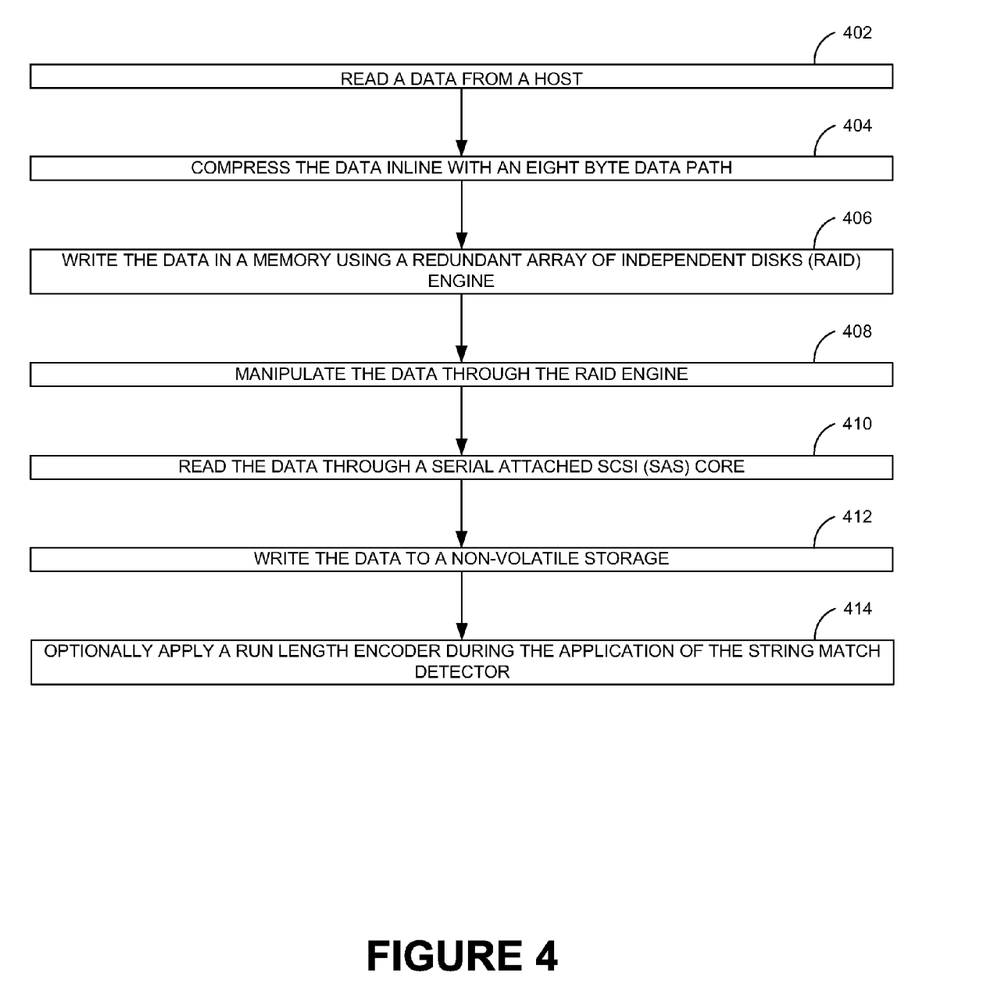
FIG. 4 is a process flow of data transfer operation illustrating compression of data inline with an eight byte data path, according to one embodiment.

FIG. 4 is a process flow of data transfer operation illustrating compression of data inline with an eight byte data path, according to one embodiment. In operation 402, data is read from the host 102. In operation 404, the data is compressed inline with an eight byte data path. For example, the data may be compressed using the data compressor 108. In operation 406, the data is written in the DDR memory 112 using the RAID engine A 106. In operation 408, the data may be manipulated through the RAID engine A 106. In operation 410, the data may be read through the SAS core 118. In operation 412, the data may be written into the non-volatile storage device 120. In operation 414, a run length encoder may be applied during the application of the string match detector. The operations of FIG. 4 may be implemented using the structures illustrated in FIG. 1 and FIG. 3.

Although the present embodiments have been described with reference to specific example embodiments, it will be evident that various modifications and changes may be made to these embodiments without departing from the broader spirit and scope of the various embodiments. For example, the various devices, modules, analyzers, generators, etc. described herein may be enabled and operated using hardware circuitry (e.g., CMOS based logic circuitry), firmware, software and/or any combination of hardware, firmware, and/ or software (e.g., embodied in a machine readable medium). For example, the various electrical structure and methods may be embodied using transistors, logic gates, and electrical circuits (e.g., application specific integrated (ASIC) circuitry and/or in Digital Signal Processor (DSP) circuitry).

Particularly, the PCIe core 104, the RAID engine A 106, the data compressor 108, the DDR controller 110, the DDR memory 112, the data decompressor 114, the RAID engine B 116, the SAS core 118, the non-volatile storage device 120, the priority encoder, the best match encoder, string encoder, RLE encoder and other coder may be enabled using software and/or using transistors, logic gates, and electrical circuits (e.g., application specific integrated ASIC circuitry) such a PCIe core circuit, a RAID engine A circuit, a data compressor circuit, a DDR controller circuit, a DDR memory circuit, a data decompressor circuit, a RAID engine B circuit, a SAS core circuit, a storage device circuit, a priority encoder circuit, a best match circuit, a string encoder circuit, a RLE encoder circuit and other coder circuit and other circuit.

In addition, it will be appreciated that the various operations, processes, and methods disclosed herein may be embodied in a machine-readable medium and/or a machine accessible medium compatible with a data processing system (e.g., a computer system), and may be performed in any order (e.g., including using means for achieving the various operations). Accordingly, the specification and drawings are to be regarded in an illustrative rather than a restrictive sense.

What is claimed is:

1. A method comprising:
   reading a data from a host;
   compressing the data inline with an eight byte data path through:
      placing the data in a buffer;
      applying a parser to the data;
      optionally applying a run length encoder operation;
      applying a dictionary to apply a comparison function;
      matching a priority encoder from all comparators;
      generating a best match decision between matrices;
      applying a string match detector across four byte lanes; and
      determining a match type; and
   writing the data in a memory using a redundant array of independent disks (RAID) engine.

2. The method of claim 1, further comprising:
   manipulating the data through the RAID engine;
   reading the data through a Serial Attached SCSI (SAS) core; and
   writing the data to a non-volatile storage.

3. The method of claim 1, further comprising reading, through the RAID engine, a portion of each strip through a RAID XOR operation.

4. The method of claim 1, wherein compressing the data inline further comprises:
   applying a compression technique based on a data history;
   maintaining a consistent order of a sequence of the data during a data compression operation and a decompression operation; and
   building a history table based on the maintenance of the consistent order of the sequence of the data.

5. The method of claim 4,
   wherein the compression operation and the decompression operation acquire data in a different sequence in a usage model.

6. The method of claim 5, wherein the compression operation and the decompression operation occur inline with a movement of the data.

7. The method of claim 1, further comprising:
   optionally applying a run length encoder during the application of the string match detector.

8. A method comprising:
   acquiring a data from a host;
   applying an eight byte data path to the data;
   compressing the data inline through:
      placing the data in a buffer;
      applying a parser to the data;
      optionally applying a run length encoder operation;
      applying a dictionary to apply a comparison function;
      matching a priority encoder from all comparators;
      generating a best match decision between matrices;
      applying a string match detector across four byte lanes; and
      determining a match type; and
   writing the data in a memory through a memory controller using a RAID engine.

9. The method of claim 8, further comprising:
   manipulating the data through the RAID engine;
   reading the data through a SAS core; and
   writing the data to a non-volatile storage.

10. The method of claim 8, further comprising reading, through the RAID engine, a portion of each strip through a RAID XOR operation.

11. The method of claim 8, wherein compressing the data inline further comprises:
    applying a compression technique based on a data history;
    maintaining a consistent order of a sequence of the data during compression and decompression; and
    building a history table based on the maintenance of the consistent order of the sequence of the data.

12. The method of claim 11,
    wherein the compression and the decompression acquire data in a different sequence in a usage model.

13. The method of claim 12 wherein the compression and the decompression occur inline with a movement of the data.

14. The method of claim 8, further comprising:
    optionally applying the run length encoder during the application of the string match detector.

15. A system comprising:
    a host;
    a Peripheral Component Interconnect Express (PCIe) core to read a data from the host;
    a data compressor of a RAID engine to compress the data inline with an eight byte data path;
    an other RAID engine to decompress and manipulate the data written to a memory;
    a memory controller to write the data to the memory;
    a buffer to temporarily store the data;
    a parser to parse the data;
    a dictionary to apply a comparison function;
    a comparator to locate a data match, to generate a best match decision between a set of matrices and to determine a match type; and
    an RLE encoder to detect data across four byte lanes and to optionally apply a run-length encoding to the data.

16. The system of claim 15, further comprising:
    a SAS core to read the data and render the data available to a non-volatile storage.

17. The system of claim 15, wherein a portion of each strip is read by the RAID engine through a RAID XOR operation.

18. The system of claim 15,
    wherein the data compressor applies a compression operation based on a data history, maintains a consistent order of a sequence of the data during compression and decompression, and builds a history table based on the maintenance of the consistent order of the sequence of the data, and
    wherein the system further comprises a data decompressor to apply the decompression operation based on the data history.

19. The system of claim 18, wherein the data compressor performs the compression operation that acquires data in a different sequence in a usage model.

20. The system of claim 19, wherein the compression and the decompression occur inline with a movement of the data.

* * * * *